(12) United States Patent
Ernelind et al.

(10) Patent No.: US 11,552,473 B2
(45) Date of Patent: Jan. 10, 2023

(54) METHOD AND SYSTEM FOR POWER BALANCING

(71) Applicant: Enequi AB, Sollentuna (SE)

(72) Inventors: Karl Martin Ernelind, Hällingsjö (SE); Vladimir Vujic, Onsala (SE)

(73) Assignee: Enequi AB, Sollentuna (SE)

( * ) Notice: Subject to any disclaimer, the term of this patent is extended or adjusted under 35 U.S.C. 154(b) by 136 days.

(21) Appl. No.: 17/048,908

(22) PCT Filed: Apr. 17, 2019

(86) PCT No.: PCT/SE2019/050355
§ 371 (c)(1),
(2) Date: Oct. 19, 2020

(87) PCT Pub. No.: WO2019/203719
PCT Pub. Date: Oct. 24, 2019

(65) Prior Publication Data
US 2021/0376611 A1 Dec. 2, 2021

(30) Foreign Application Priority Data
Apr. 20, 2018 (SE) .................................... 1850473-8

(51) Int. Cl.
*H02J 3/26* (2006.01)
*H02J 7/00* (2006.01)
(Continued)

(52) U.S. Cl.
CPC .............. *H02J 3/26* (2013.01); *G05B 19/042* (2013.01); *H02J 3/14* (2013.01); *H02J 3/144* (2020.01);
(Continued)

(58) Field of Classification Search
CPC .... H02J 3/32; H02J 3/144; H02J 3/381; H02J 7/0048; H02J 13/00002; H02J 2300/22;
(Continued)

(56) References Cited

U.S. PATENT DOCUMENTS

2014/0070617 A1 3/2014 Detmers et al.
2014/0365027 A1 12/2014 Namba et al.
(Continued)

FOREIGN PATENT DOCUMENTS

WO 2014165938 A1 10/2014

*Primary Examiner* — Ziaul Karim
(74) *Attorney, Agent, or Firm* — Capitol City TechLaw

(57) ABSTRACT

The present invention relates to a method for power balancing a power grid (10) having multiple phases (12:1,2 3) and a common ground (0). The power grid (10) is connected to at least one load (13, 17) causing a non-uniform power consumption between the multiple phases (12: 1, 2, 3) of the power grid (10). The method comprises: monitoring power provided to the power grid (10) in controller (18), storing available energy in the power grid (10) in an energy storage (16) using multiple inverters (I1, I2, I3), each inverter (I1, I2, I3) is connected between the energy storage (16) and each phase (12: 1, 2, 3) of the power grid (10), and redistributing power between phases (12: 1, 2, 3) based on power available in the energy storage (16) by controlling power flow through the inverters (I1, I2, I3) by the controller (18) based on the non-uniform power consumption.

17 Claims, 4 Drawing Sheets

(51) Int. Cl.
*H02J 13/00* (2006.01)
*H02J 3/14* (2006.01)
*G05B 19/042* (2006.01)
*H02J 3/38* (2006.01)

(52) U.S. Cl.
CPC ............ *H02J 3/381* (2013.01); *H02J 7/0048* (2020.01); *H02J 13/00002* (2020.01); *G05B 2219/2639* (2013.01); *H02J 2300/22* (2020.01); *H02J 2300/28* (2020.01)

(58) Field of Classification Search
CPC .. H02J 2300/28; H02J 3/14; H02J 3/26; H02J 2310/12; G05B 19/042; G05B 2219/2639; Y02B 70/3225; Y02E 40/50; Y04S 20/222; G01R 29/16
See application file for complete search history.

(56) References Cited

U.S. PATENT DOCUMENTS

| | | | |
|---|---|---|---|
| 2016/0013646 A1* | 1/2016 | Akerson | H02J 13/00004 307/39 |
| 2016/0033986 A1* | 2/2016 | Kamel | G05F 1/66 700/295 |
| 2017/0047742 A1* | 2/2017 | Narla | H02J 3/381 |
| 2017/0104362 A1* | 4/2017 | Yang | H02J 7/0068 |
| 2017/0317523 A1* | 11/2017 | Adest | H02J 3/381 |
| 2017/0336821 A1* | 11/2017 | Ramezan Pour Safaei | G05F 1/67 |

* cited by examiner

METHOD AND SYSTEM FOR POWER BALANCING

This application claims priority under 35 USC 119(a)-(d) from SE patent application No. 1850473-8 filed Apr. 20, 2018, the entire content of which is incorporated herein by reference.

TECHNICAL FIELD

The present disclosure pertains to the field of power balancing between phases in a power grid. More particularly, the invention pertains to compensate for loads having a non-uniform power consumption between phases in the power grid.

BACKGROUND

Local power grid, such as households, often experience power balancing issues causing the main fuse situated between the local power net and the main power grid to break. This is mainly due to loads having a non-uniform impact on the phases in the local power grid. A typical example of such a load is a single phase car charger to an electric car. Furthermore, if the local power grid is provided with an energy producing unit, such as solar panels, wind mill, etc., the energy units may introduce a power balancing problem. Controllable loads, such as electric cars, also affects the power distribution in local power grids and adds to balancing issues in local power grids.

US2014/0070617A1 discloses method and apparatus for stabilizing power on an electric grid using networked distributed energy storage systems.

WO2014165938A1 discloses an inverter energy system supplying power to a site with energy generation and load compensation.

SUMMARY

An object of the present disclosure is to provide a method and controller, which seeks to mitigate, alleviate, or eliminate one or more of the above-identified deficiencies in the art and disadvantages singly or in any combination.

This object is obtained by a method for power balancing a power grid having multiple phases and a common ground. The power grid is connected to at least one controllable load causing a non-uniform power consumption between the multiple phases of the power grid. The method comprises monitoring power provided to the power grid in a controller; storing available energy in the power grid in an energy storage using multiple inverters, each inverter is connected between the energy storage and each phase of the power grid; redistributing power between phases based on power available in the energy storage by controlling power flow through the inverters by the controller based on the non-uniform power consumption, and adapting the power consumption of the at least one controllable load based on the power provided to the power grid and charge status of the energy storage.

This object is also obtained by a controller for power balancing a power grid having multiple phases and a common ground. The power grid is connected to at least one controllable load causing a non-uniform power consumption between the multiple phases of the power grid. The controller comprises an energy storage configured to store available energy in the power grid; and inverters provided between the power grid and the energy storage, each inverter is connected between the energy storage and each phase of the power grid. The controller is further configured to monitor power provided to the power grid; to redistribute power between phases based on power available in the energy storage by controlling power flow through the inverters based on the non-uniform power consumption, and to adapt the power consumption of the at least one controllable load based on the power provided to the power grid and the charge status of the energy storage.

An advantage with the present invention is that controllable loads causing a difference in power distribution between the phases may be controlled in order to avoid over-discharge of the energy storage when sufficient power in the power grid is not available.

According to an aspect, the power grid is connectable to an external power grid, and the step of monitoring power further comprises monitoring power flow between the power grid and the external power grid, and further comprising redistributing power between phases to limit the power flow between the external power grid and the power grid.

An advantage with this aspect is that the maximum power provided from an external power grid may be controlled in order to prevent fuses to break due to high load on a specific phase on the power grid.

Further objects and advantages are described in detailed description.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the example embodiments.

DETAILED DESCRIPTION

Figure 1:
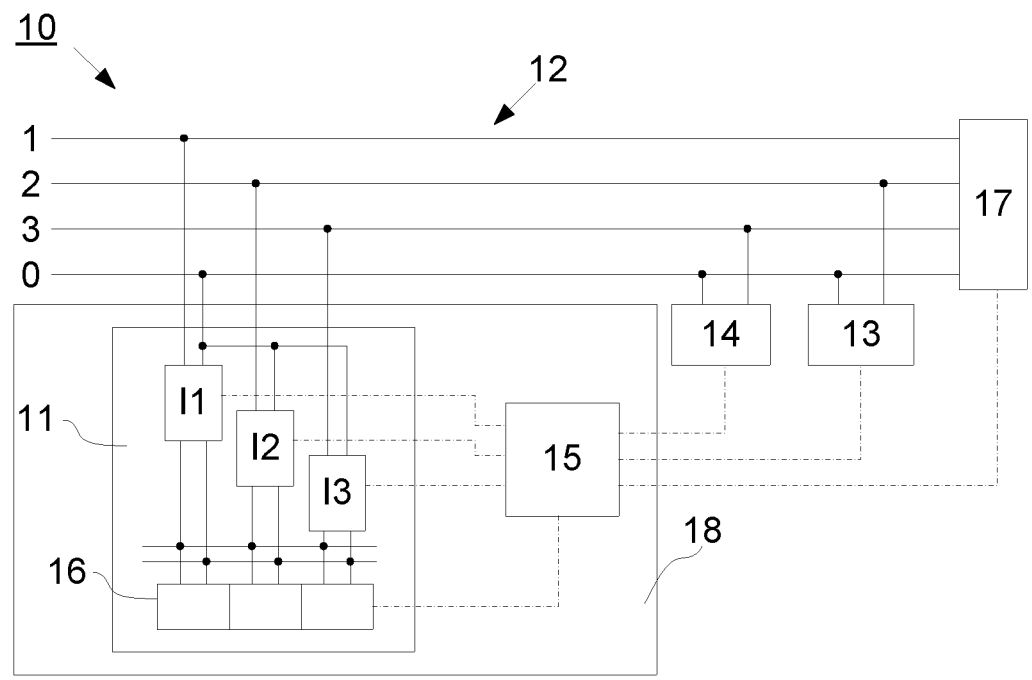
FIG. 1 is a power grid provided with a first embodiment of a controller for power balancing.

Aspects of the present disclosure will be described more fully hereinafter with reference to the accompanying drawings. The apparatus and method disclosed herein can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the invention. As used herein, the singular forms "a", "an" and "the" are intended to include the plural forms as well, unless the context clearly indicates otherwise.

Some of the example embodiments presented herein are directed towards a method and controller for power balancing a power grid having multiple phases. As part of the development of the example embodiments presented herein, a problem will first be identified and discussed. Uneven power distributions within a power grid may cause fuses to break or even more severe damage to appliances in a household. Furthermore, in order to accommodate for occasional access to the main grid during peak hours, with unusual high power consumption, it is necessary to purchase access to the main grid using high power fuses. This is unnecessary expensive.

Elimination of non-uniform power consumption within a grid has many beneficial advantages, one of them is that the marking on the fuses may be reduced and thus the cost for access to the main grid will be reduced. Another advantage is that fuses will not break as often as when not power balancing the power grid.

FIG. 1 discloses a power balancing system for a power grid 10 provided with a first embodiment of a controller 18. The power grid 10 has multiple phases 12, each phase denoted 1, 2 and 3, and a common ground, denoted 0, and is connected to at least one load 13, 17 causing a non-uniform power consumption between the multiple phases 12 of the power grid 10. The controller 18 comprises a processor 15; an energy storage 16 configured to store available energy in the power grid 10, and inverters I1, I2 and I3, provided between the power grid 10 and the energy storage 16. Each inverter is connected between the energy storage 16 and each phase 12 of the power grid 10.

The processor 15 is configured to: monitor power provided to the power grid 10, determine the charge status of the energy storage 16, and redistribute power between phases based on charge status of the energy storage (16) by controlling power flow through the inverters I1-I3) based on the non-uniform power consumption. Power provided to the power grid may be monitored by a meter in a fuse box connected to an external grid (if applicable) and/or a meter provided in an energy producer 14) (wind and/or solar). According to some aspects, the charge status of the energy storage is State-of-Health, SOC of a battery storage.

According to some aspects of the invention, the power grid 10 is connectable to an external power grid (not shown), and the processor further is configured to monitor power flow between the power grid and the external power grid, as described below. According to some aspects, the configuration in FIG. 1 does not require access to an external power grid provided an energy producing systems 14 is provided. The processor 15 is further configured to monitor power flow between the power grid 10 and the at least one energy producing system 14. As an example, the at least one energy producing system may be a solar power system and/or a wind power system.

Figure 2:
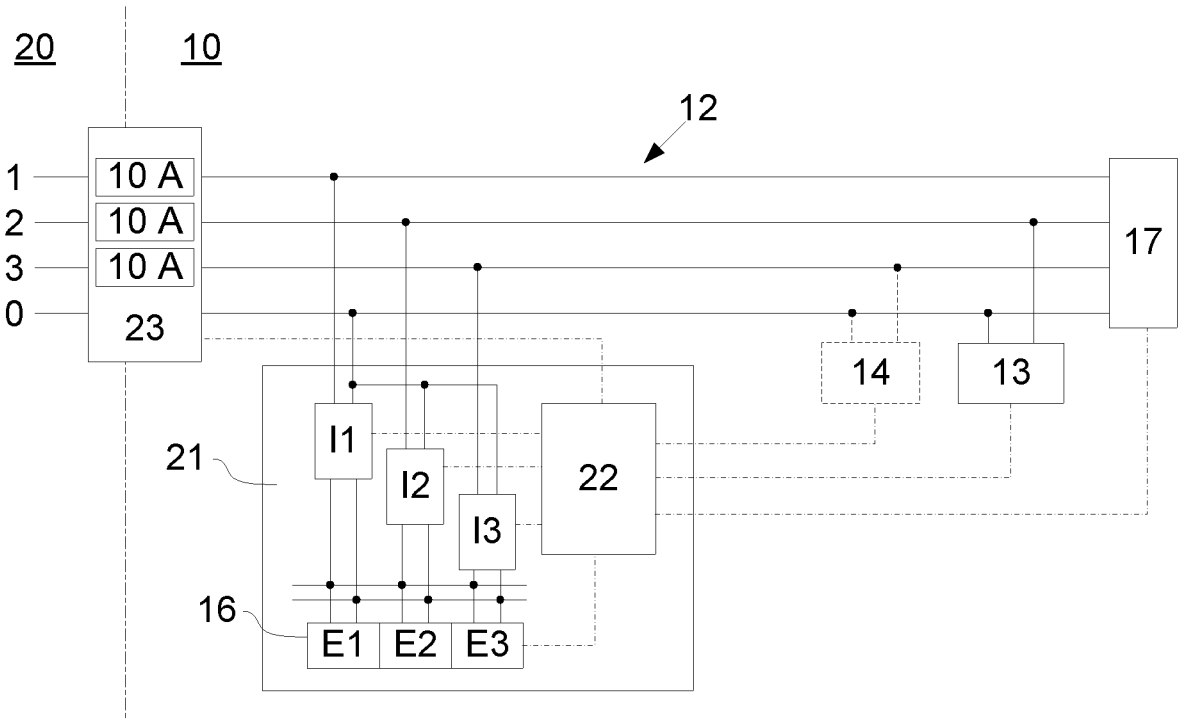
FIG. 2 is a power grid provided with a second embodiment of a controller for power balancing.

FIG. 2 discloses a power balancing system for a power grid 10 provided with a second embodiment of a controller 21. The features indicated by dashed lines are optional features, and the dash-dotted lines illustrates data communication between different components of the system. In addition to the system described in connection with FIG. 1, FIG. 2 discloses a power grid 10 connected to an external power grid 20, and the processor 22 further is configured to monitor power flow between the power grid 10 and the external power grid 20, using the meter 23, which monitors the flow into the power grid 10, but may also comprises functionality to monitor power flow from the power grid to the external grid. The fuses (here indicated as maximum 10 Ampere current AC will limit the power flow between the external power grid 20 and the power grid. As indicated in FIG. 2, the processor 22 is configured to redistribute power between phases 1-3 to limit the power flow via the meter 23.

In order to be able to benefit from the disclosed system, it is necessary to store energy in an energy storage if there is excess power available at one or more phases of the power grid 10. The stored energy in the energy storage may be directed as power via one or more of the inverters I1-I3 to boost the available power for the loads 13, 14 without having to exceed the stipulated limitations of the fuses between the power grid and the external grid (e.g. the main grid). Thus, the processor 22 is configured to redistribute power between phases to limit the power flow between the external power grid 20 and the power grid 10.

Figure 3:
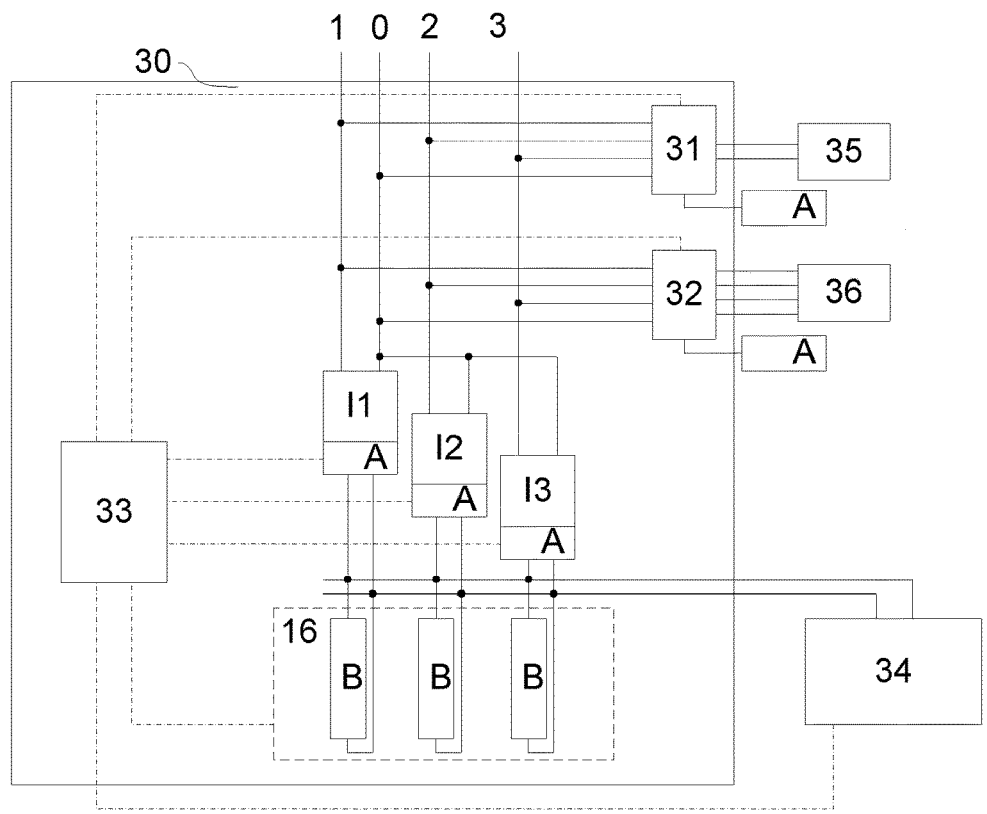
FIG. 3 is an example embodiment of a controller for power balancing provided with car chargers.

FIG. 3 is an example embodiment of a controller 30 for power balancing provided with car chargers 31 and 32 As mentioned above, the controller 30 comprises a processor 33, inverters I1-I3 and energy storage 16. In addition, the controller 33 is further connectable to at least one controllable load 35 and 35 via interfaces 31 and 32. The processor 33 is further configured to adapt the power consumption of the at least one controllable load 31, 32 based on the power provided to the power grid (either from a main grid or from energy produced within the power grid) and the charge status of the energy storage 16. If necessary, the power to the controllable loads is reduced to a suitable level to prevent unbalancing within the power grid, and also to prevent fuses to break. The interfaces 31 and 32 is provided with a separate meter, to see charge current when charging your vehicle. In addition, the energy storage is further provided with an extra energy storage 34 that may be used to maintain a base level in case needed.

According to some aspects, the at least one controllable load is a single phase controllable load 31 and/or a three phase controllable load 32. These are typically car chargers for electric vehicles, or plugin-hybrid electric vehicles.

It should also be noted that the power flowing through the inverters I1-I3 may be in both directions and the processor is configured to control each inverter and to monitor the power flowing through each inverters, as illustrates in FIG. 3.

Figure 4:
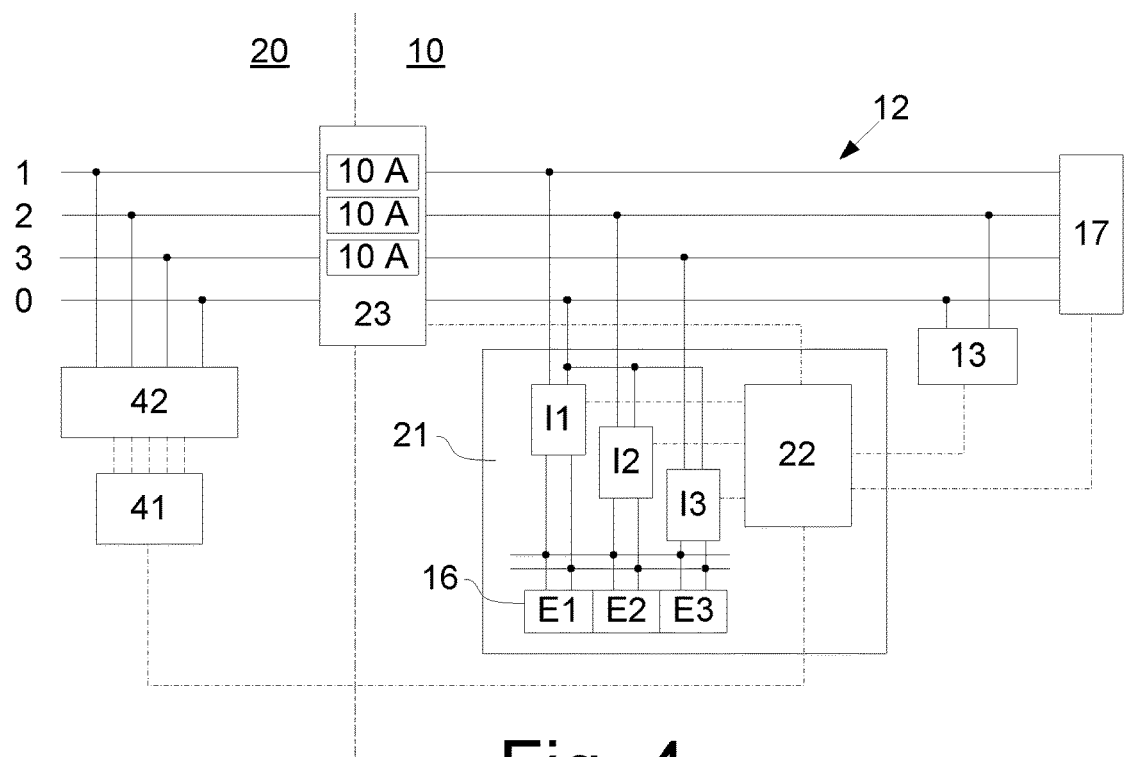
FIG. 4 is schematic view of a local power grid connected to an external grid.

FIG. 4 is schematic view of a local power grid 10, similar to that disclosed in connection with FIG. 2, connected to an external grid 20. In this example, the processor 22 in the controller 21 is configured to communicate with an external controller 41 handling the external power grid 20 and to provide power or load to the external power grid 20 on demand, e.g. for power balancing purposes in the external power grid, based on the charge status of the energy storage 16.

The communication between the controller 21 and the controller of the external power grid may be wired or wireless and use any suitable type of communication protocol.

Figure 5:
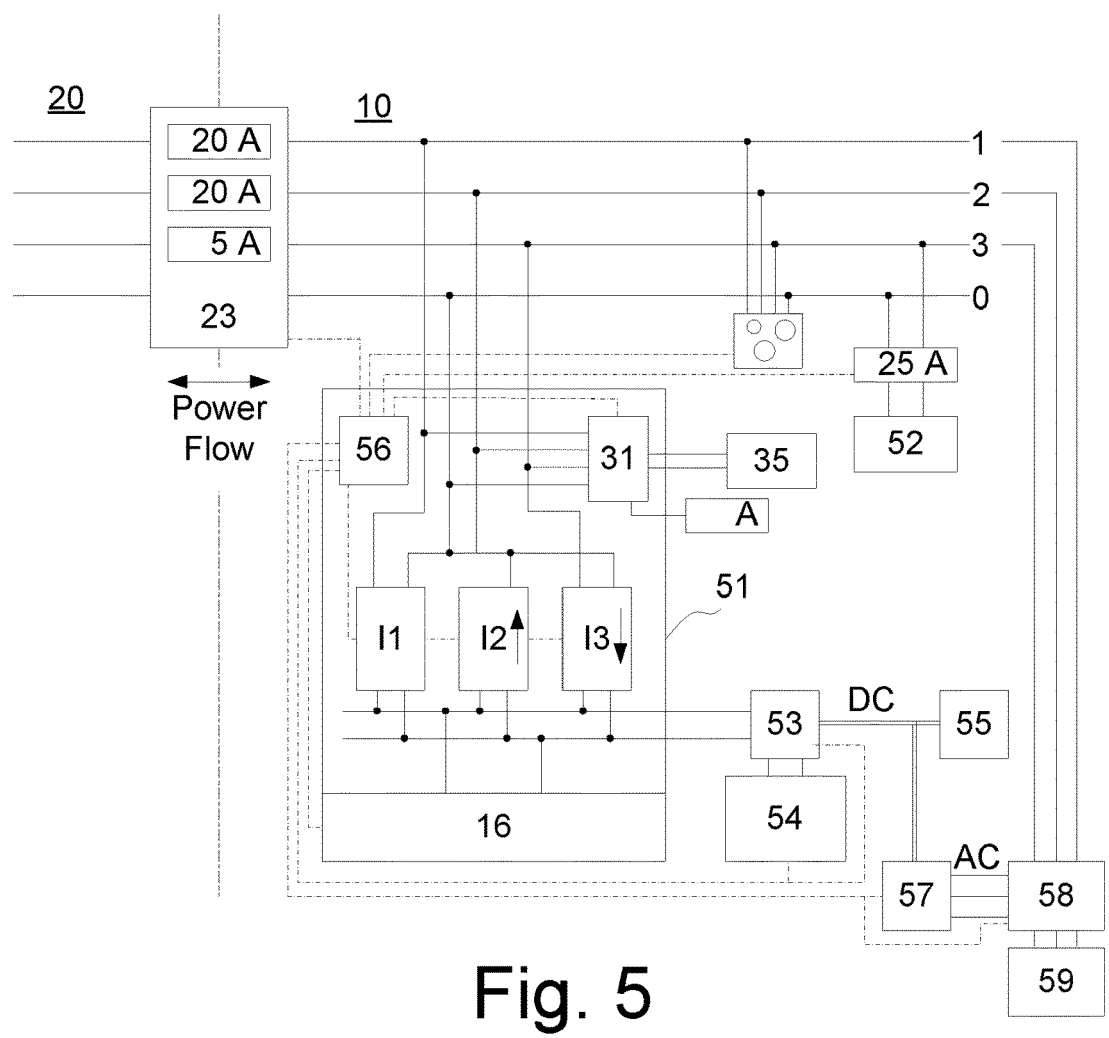
FIG. 5 is a power grid with a third embodiment of a controller for power balancing.

FIG. 5 is a power grid 10 with a third embodiment of a controller 51 for power balancing. As mentioned before, the power grid is connected to an external power grid 20 via fuses and power meter 23 configured to measure power flowing between the power grid 10 and the external power grid 20. The controller 51 comprises inverters I1-I3 connected between each phase of the power grid and an energy storage 16, as explained above. A single phase controllable load 35 is attached to the interface 31, and the processor 56 is configured to monitor all relevant values to balance the power within the power grid depending on the charge status of the energy storage.

In addition, the processor 56 is further configured to provide emergency power 54 to selected loads 55 connected to the power grid 10 when no power is provided to the power grid 10. This may occur during a power failure simultaneous with not power produced by the local energy producers (e.g. during night). The emergency power may be seen as an energy extender and certain key functions in the household may be dedicated to be served by the energy extender. According to some aspects, the selected loads 55 is power by a DC voltage to avoid losses included when converting between DC to AC from the emergency power pack 54. The processor is configured to control a switch 53, which redirects the power from the emergency power to the selected loads 55 when the processor indicate that this is necessary.

In addition, selected AC loads 59 may be prioritized and a secondary AC source 57 is provided, which is charged via the switch 53. When the power grid is operational, an AC switch 58 is configured to provide AC power from the grid. However, if no power is provided to the power grid 10, the AC switch 58 is configured to provide AC power from the secondary AC source 57. The processor 56 is configured to control the AC switch 58 and to monitor the charge status of the secondary AC source 57.

Figure 6:
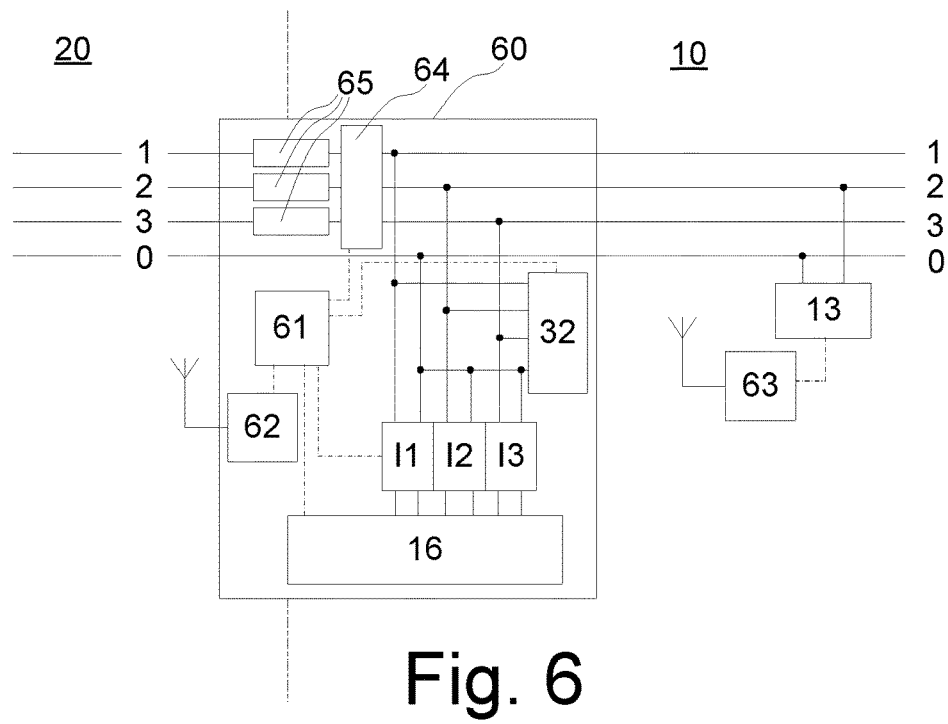
FIG. 6 is a power grid with a controller with integrated power fuses.

FIG. 6 is a power grid 10 with a controller 60 with integrated power fuses 65. The controller 60 comprises single phase inverters I1-I3 (as described above), an energy storage 16, a processor 61 and an interface 32 for a controllable load (not shown). In addition, each of the at least one load 13 (only one is illustrated for illustration purposes) is provided with a communication device 63. The controller 60 is further configured to communicate 62 with each of the at least one load 13 to monitor a power consumption level thereof, and to redistribute power based on the power consumption level of each of the at least one load.

According to some aspects, the communication between the processor 61 and each load 13 is performed via Bluetooth MESH. A suitable type of inverters is a 12A(DC)/8A(AC). Furthermore, sensors are provided in suitable positions for monitoring purposes. The interface intended to be used together with a car charger may have the functionality to measure current, voltage, phase and a communication port often provided in electric vehicles to optimize the charging process.

FIGS. 1-6 discloses power balancing systems comprising a power grid 10 having multiple phases and a common ground, at least one load 13, 14, 17; 31, 32 causing a non-uniform power consumption between the multiple phases 12 of the power grid 10 and a controller as described above.

Figure 7:
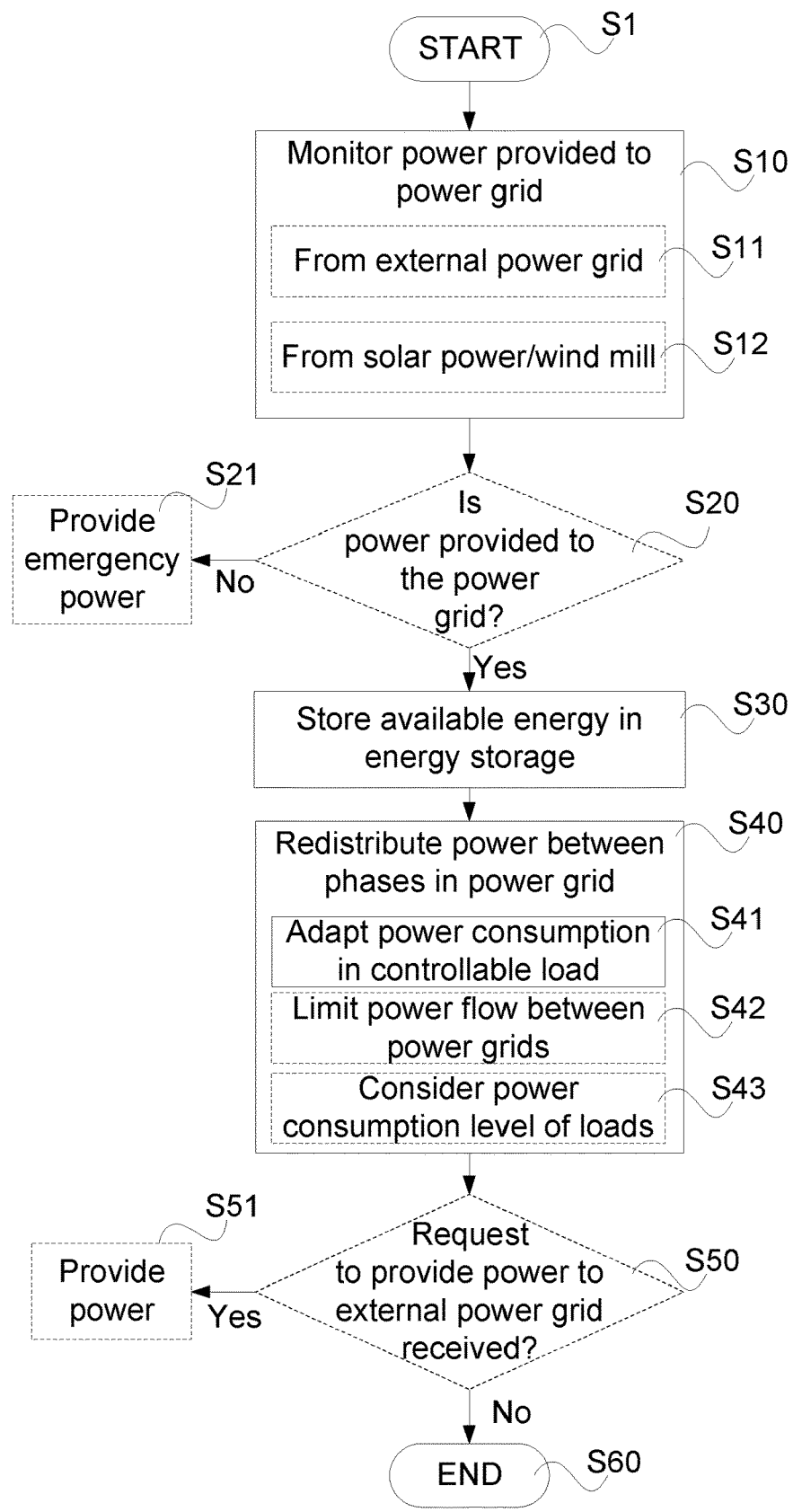
FIG. 7 is a flow chart for balancing power in a power grid.

FIG. 7 is a flow chart for balancing power in a power grid having multiple phases and a common ground, the power grid being connected to at least one load causing a non-uniform power consumption between the multiple phases of the power grid. The at least one load may include controllable and non-controllable loads. Examples of loads are heat pump, stove, washing machine, tumble dryer, car chargers, etc.

The flow starts at step S1, and proceeds to step S10 to monitor power provided to the power grid in a controller. This may be achieved by an external power grid and/or local energy producers of solar power systems, windmill systems. According to some aspects, the power grid is connectable to an external power grid 20, and the step of monitoring power further comprises monitoring S11 power flow between the power grid 10 and the external power grid 20. According to another aspects, wherein the power grid 10 is connectable to at least one energy producing system 14, and the step of monitoring power further comprises monitoring S12 power flow between the power grid 10 and the at least one energy producing system 14.

In an optional step S20, it is investigated if power is provided to the power grid 10, and if not emergency power is provided which powers selected loads S21. If power is provided the flow continues to step S30, wherein available energy is stored in the power grid 10 in an energy storage using multiple inverters, each inverter being connected between the energy storage and each phase of the power grid. The state-of-charge, SOC of the energy storage (e.g., NiMH batteries provided from Nilar® International AB in Sweden) has to be over a certain lower level, e.g. 20% SOC, and does not normally exceed an SOC of 80%.

The next step S40 comprises redistributing power between phases based on charge status of the energy storage 16 by controlling power flow through the inverters by the controller based on the non-uniform power consumption.

At least one load comprises at least one controllable load, and the method further comprising adapting S41 the power consumption of the at least one controllable load based on the power provided to the power grid and charge status of the energy storage. According to some aspects, the at least one controllable load is selected to be a single phase controllable load and/or a three phase controllable load.

According to some aspects, the method further comprising limiting S42 the power flow between the external power grid and the power grid when redistributing power between phases in the power grid to prevent that the fuses break. According to some aspects, each of the at least one load is provided with a communication device, the method further comprising monitoring power consumption level of each of the at least one load and communicating the power consumption level to the controller and considering S43 the power consumption level of each of the at least one load when redistributing power.

When the power grid is connected to an external power grid 20, the method may further comprise communicating with an external controller handling the external power grid and providing power and/or load S51 to the external power grid on demand based on charge status of the energy storage, e.g. to provide power balancing in the external power grid.

Furthermore, the disclosure also comprises a computer program for balancing a power grid, comprising instructions which, when executed on at least one processor, cause the at least one processor to carry out the method according to the features disclosed in connection with FIG. 7.

In addition, the disclosure also comprises a computer-readable storage medium carrying a computer program for balancing a power grid.

In the drawings and specification, there have been disclosed exemplary embodiments. However, many variations and modifications can be made to these embodiments. Accordingly, although specific terms are employed, they are used in a generic and descriptive sense only and not for purposes of limitation, the scope of the embodiments being defined by the following claims.

The invention claimed is:

1. A method for power balancing a power grid having multiple phases and a common ground, the power grid being connected to at least one load causing a non-uniform power consumption between the multiple phases of the power grid, and the power grid being connectable to an external power grid, the method comprising:
monitoring power provided to the power grid in a controller, and monitoring power flow between the power grid and the external power grid;
storing available energy in the power grid in an energy storage using multiple inverters, each inverter being connected between the energy storage and each phase of the power grid, and determining a charge status of the energy storage;

redistributing power between phases based on the charge status of the energy storage by controlling power flow through the inverters by the controller based on the non-uniform power consumption;

wherein the at least one load comprises at least one controllable load;

adapting the power consumption of the at least one controllable load based on the power provided to the power grid and the charge status of the energy storage; and limiting the power flow between the external power grid and the power grid when redistributing power between phases in the power grid.

2. The method according to claim 1, further comprising communicating with an external controller handling the external power grid and providing power and/or load to the external power grid on demand based on the charge status of the energy storage.

3. The method according to claim 1, wherein the at least one controllable load is selected to be a single phase controllable load and/or a three phase controllable load.

4. The method according to claim 1, wherein the power grid is connectable to at least one energy producing system, and the step of monitoring power further comprises monitoring power flow between the power grid and the at least one energy producing system.

5. The method according to claim 4, wherein the at least one energy producing system is selected to be a solar power system and/or a wind power system.

6. The method according to claim 1, further comprising providing emergency power to selected loads connected to the power grid when no power is provided to the power grid.

7. The method according to claim 1, wherein each of the at least one load is provided with a communication device, the method further comprising monitoring power consumption level of each of the at least one load and communicating the power consumption level to the controller and considering the power consumption level of each of the at least one load when redistributing power.

8. A controller for power balancing a power grid having multiple phases and a common ground, the power grid being connectable to at least one load causing a non-uniform power consumption between the multiple phases of the power grid, and the power grid being connectable to an external power grid, the controller comprising:
a processor;
an energy storage configured to store available energy in the power grid;
inverters, each inverter connected to the energy storage and connectable to each phase of the power grid;
wherein the processor is configured to
monitor power provided to the power grid, and monitor power flow between the power grid and the external power grid,
determine a charge status of the energy storage, and
redistribute power between phases based on the charge status of the energy storage by controlling power flow through the inverters based on the non-uniform power consumption;
wherein the at least one load comprises at least one controllable load; and
wherein the processor is further configured to
adapt the power consumption of the at least one controllable load based on the power provided to the power grid and the charge status of the energy storage, and
redistribute power between phases to limit the power flow between the external power grid and the power grid.

9. The controller according to claim 8, wherein the processor is further configured to communicate with an external controller handling the external power grid and to provide power and/or load to the external power grid on demand based on the charge status of the energy storage.

10. The controller according to claim 8, wherein the power grid is connectable to at least one energy producing system, and the processor is further configured to monitor power flow between the power grid and the at least one energy producing system.

11. The controller according to claim 8, wherein the processor is further configured to provide emergency power to selected loads being connectable to the power grid when no power is provided to the power grid.

12. The controller according to claim 8, wherein each of the at least one connectable load is provided with a communication device, the controller is further configured to communicate with each of the at least one load to monitor a power consumption level thereof, and to redistribute power based on the power consumption level of each of the at least one load.

13. A power balancing system comprising:
a power grid having multiple phases and a common ground and being connectable to an external power grid;
at least one load causing a non-uniform power consumption between the multiple phases of the power grid; and
a controller according to claim 8.

14. The power balancing system according to claim 13, wherein the at least one load is a single phase controllable load and/or a three phase controllable load.

15. The power balancing system according to claim 13, wherein the power grid is connected to at least one energy producing system being a solar power system and/or a wind power system.

16. A computer program for balancing a power grid, comprising instructions which, when executed on at least one processor, cause the at least one processor to carry out the method according to claim 1.

17. A non-transitory computer-readable storage medium carrying the computer program for balancing a power grid according to claim 16.

* * * * *